(12) United States Patent
Kanamaru et al.

(10) Patent No.: US 6,660,541 B2
(45) Date of Patent: Dec. 9, 2003

(54) SEMICONDUCTOR DEVICE AND A MANUFACTURING METHOD THEREOF

(75) Inventors: Masatoshi Kanamaru, Miho (JP); Yoshishige Endo, Tsuchiuta (JP); Takanori Aono, Chiyoda (JP); Ryuji Kohno, Chiyoda (JP); Hideyuki Aoki, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/280,117

(22) Filed: Oct. 23, 2002

(65) Prior Publication Data

US 2003/0113944 A1 Jun. 19, 2003

(30) Foreign Application Priority Data

Oct. 23, 2001 (JP) ........................................ 2001-324324

(51) Int. Cl.[7] .............................................. H01L 21/66
(52) U.S. Cl. ............................. 438/14; 438/10; 438/17
(58) Field of Search ............................. 438/14, 15, 17, 438/18, 5, 10, 11

(56) References Cited

U.S. PATENT DOCUMENTS 5,920,765 A * 7/1999 Naum et al. ................. 438/17
6,084,267 A * 7/2000 Petrosino ...................... 438/14
6,265,245 B1 * 7/2001 Farnworth et al. ............ 438/17
6,383,825 B1 * 5/2002 Farnworth et al. ............ 438/14
6,455,335 B1 * 9/2002 Kohno et al. .................. 438/14
6,531,327 B2 * 3/2003 Kanamaru et al. ............. 438/17
6,566,150 B2 * 5/2003 Kohno et al. .................. 438/14

FOREIGN PATENT DOCUMENTS

| JP | 01-150863 | 6/1989 |
| JP | 07-007052 | 1/1995 |

* cited by examiner

Primary Examiner—Kevin M. Picardat
(74) Attorney, Agent, or Firm—Townsend and Townsend and Crew LLP (57) ABSTRACT

A method of manufacturing a semiconductor device includes forming process of forming a semiconductor element on a semiconductor wafer and testing process of testing electrical performance of the formed semiconductor element. The testing process includes process of electrically connecting a testing apparatus to an electrode pad formed on the semiconductor element to be tested. The testing apparatus has a probe-formed substrate including a plurality of beams having probes to be electrically connected to the electrode pads. The probe-formed substrate has a first beam having at least one probe for electrically connection with the electrode pad and a second beam having a number of probes for electrical connection with the electrode pads of which number is more than the number of the electrode pads electrically connected by said first beam.

12 Claims, 9 Drawing Sheets

SEMICONDUCTOR DEVICE AND A MANUFACTURING METHOD THEREOF

BACKGROUND OF THE INVENTION

The invention relates to a semiconductor device and a method of manufacturing the semiconductor device, and in particular, to a semiconductor device and a method of manufacturing the semiconductor device to obtain a high degree of reliability and a high yield.

Methods of manufacturing semiconductor devices such as IC and LSI have front process of forming integrated circuits on a surface of a silicon wafer and a testing process of testing the electrical characteristics of each circuit in a predetermined stage to judge whether the circuit is defective or non-defective every chip. Alternatively, the methods have back process including a process of separating the silicon wafer into individual chips or a process of further encapsulating the chips with resin, ceramic or the like as the occasion demands.

The above testing of electrical characteristics can be broadly divided into a probing test for judging good or wrong of conduction between circuits, a burn-in test for acceleratively screening failures by applying thermal and electrical stresses to the circuits, and a final test for finally testing the circuits at high frequencies.

In the above various kinds of testing methods all, basic connecting means between a wafer to be tested or a chip to be tested and an external test system are the same. They use a method of mechanically pressing conductive fine probes individually on electrode pads of aluminum alloy or other alloys, which pads have a square ranging between several tens $\mu$m and one hundred several tens $\mu$m and a thickness of about 1 $\mu$m and are patterned with a pitch ranging between several tens $\mu$m and one hundred several tens $\mu$m on a wafer to be tested. As an example of the above described probe, there is a tungsten probe of which tip has a curvature of about 20 $\mu$m.

Concerning the above described processes in the methods of manufacturing semiconductor devices, JP-A-1-150863 discloses a configuration in which a bridge of which both ends are fixed on a top surface of a substrate is formed, and a probe is formed at the center of the bridge, and conductive wiring is formed from the probe. JP-A-7-7052 discloses a configuration in which a cantilever structure is held by an insulating substrate having conductive wiring patterns formed thereon and is used as a probe for measuring electrical characteristics.

In the methods of testing semiconductor devices as described above with reference to the prior art, there are the following problems.

In all the known methods described above, a plurality of bridges or cantilever structures are individually bonded to a substrate, and therefore much time and effort are required for positioning and fixing probes with high accuracy. Further, for the known methods, it is difficult to cope with the demands for narrower pitches and also it is not easy to improve manufacturing yield. Also, it is considered that it is difficult for the bonding method to reduce variations in the height of the probes when a plurality of probes are formed.

Also, with increasing integration of semiconductor elements, narrow-pitch testing technology and low-load testing technology reducing damage applied to thin film electrode pads of semiconductor elements are more desired.

The invention is intended to resolve the above described problems. An object of the invention is, in the testing of electrical characteristics of semiconductor devices, to provide a semiconductor device and a method of manufacturing the semiconductor device allowing efficient manufacturing of the semiconductor device, wherein the method has, for example, an efficient testing process reliably bringing the probes into contact with the electrode pads formed with a narrow pitch on semiconductor element to be tested.

SUMMARY OF THE INVENTION

A method of manufacturing a semiconductor device according to a first aspect of the invention has a forming process of forming a semiconductor element comprising electrode pads on a semiconductor wafer and testing process of testing the electrical performance of the formed semiconductor element, the testing process including connecting process of electrically connecting a testing apparatus to the electrode pads formed on the semiconductor element to be tested, the connecting process electrically connecting the testing apparatus to the electrode pads, the testing apparatus having a probe-formed substrate comprising a plurality of beams having probes to be electrically connected to the electrode pads, and the probe-formed substrate having a first beam having at least one probe for electrically connection with the electrode pad and a second beam having a number of probes for electrical connection with the electrode pads of which number is more than the number of the electrode pads electrically connected by the first beam.

Preferably, the beam structure can be formed such that the pressing force applied to each probe may be made constant according to a different number of probes formed on the first beam, and it can be easily cope with electrode pads with a narrow pitch while suppressing the difference between the pressing forces, and wiring is connected from the probes to secondary electrode pads via an insulating layer.

By the way, the manufacturing method of the invention is adaptable to a semiconductor device in which a pitch between adjacent electrode pads is as narrow as equal to or less than 80 $\mu$m.

Also, in the above described method of manufacturing a semiconductor device, the second beam may have a beam cross section larger than that of the first beam.

Also, in the above described method of manufacturing a semiconductor device, the second beam may have a beam length shorter than that of the first beam.

Also, in the above described method of manufacturing a semiconductor device, the second beam may have a beam width or beam thickness larger than that of the first beam.

A method of manufacturing a semiconductor device according to a second aspect of the invention has forming process of forming a semiconductor element comprising electrode pads on a semiconductor wafer and testing process of testing the electrical performance of the formed semiconductor element, the testing process including connecting process of electrically connecting a testing apparatus to the electrode pads formed on the semiconductor element to be tested, the connecting process electrically connecting the testing apparatus to the electrode pads, the testing apparatus having a probe-formed substrate comprising a beam having a probe to be electrically connected to the electrode pad and a plurality of secondary electrodes connected to the probe through wiring, and the probe-formed substrate having a first wiring for connection with a first probe and having a first wiring width and a second wiring for connection with a second probe and having a second wiring width larger than the first wiring width.

By the way, the comparing of the wiring width may be done in volume or projected area of the wiring.

Also, in the above described method of manufacturing a semiconductor device, the second wiring may have a wiring width equal to or more than twice as wide as that of the first wiring.

Also, in the above described method of manufacturing a semiconductor device, the second wiring may have a wiring width equal to or more than 10 times as wide as that of the first wiring.

Also, in the above described method of manufacturing a semiconductor device, the first wiring may be a signal line and the second wiring may be a power supply line or a ground line.

A method of manufacturing a semiconductor device according to a third aspect of the invention has forming process of forming a semiconductor element on a semiconductor wafer and testing process of testing the electrical performance of the formed semiconductor element, the testing process including connecting process of electrically connecting a testing apparatus to an electrode pad formed on the semiconductor element to be tested, the connecting process electrically connecting the testing apparatus to the electrode pad, the testing apparatus having a probe-formed substrate comprising a plurality of beams formed thinner than the thickness of surroundings, the beams comprising a first beam having a probe to be electrically connected to the electrode pad and a second beam having no probe.

A method of manufacturing a semiconductor device according to a fourth aspect of the invention includes forming process of forming a semiconductor element on a semiconductor wafer and testing process of testing the electrical performance of the formed semiconductor element, the testing process including connecting process of electrically connecting a testing apparatus to an electrode pad formed on the semiconductor element to be tested, the connecting process electrically connecting the testing apparatus to the electrode pad, the testing apparatus having a probe-formed substrate comprising a plurality of beams having a probe to be electrically connected to the electrode pad, a first beam for connection with the probe-formed substrate through a first supporting portion, and a second beam for connection with the substrate through a second supporting portion having a number of supporting portions more than that of the first beam. For example, the probe-formed substrate comprises both a both-ends-supported beam and a cantilever beam.

A method of manufacturing a semiconductor device according to a fifth aspect of the invention include forming process of forming a semiconductor element on a semiconductor wafer and testing process of testing the electrical performance of the formed semiconductor element, the testing process including connecting process of electrically connecting a testing apparatus to electrode pads formed on the semiconductor element to be tested, the connecting process electrically connecting the testing apparatus to the electrode pads, the electrode pads being formed along sides of periphery of the semiconductor element after it is cut out of the wafer, and the testing apparatus having a probe-formed substrate comprising a plurality of beams having probes to be electrically connected to the electrode pads, and a beam having probes for connection with the electrodes pads of at least two sides of the sides being supported on the probe-formed substrate by a plurality of supporting portions.

For example, the beam having probes for connection with the electrode pads of the two sides may be configured to be connected to the probe-formed substrate by a both-ends-supported beam. Also, probes for connection with the other electrode pads may be supported on the substrate by a cantilever.

Further, the beam may use a beam made of silicon. Also, it is possible to form outline of the beam by dry-etching processing.

A semiconductor device according to the present invention is characterized by being manufactured by any of the above described manufacturing methods.

Also, in order to make uniform each of the pressing forces of the probes, it is possible to form a single material or composite material on a surface opposite to the probe-formed surface of the beam. When silicon is applied to the beam, the micro-machining technology of silicon can be applied to the processing of the beam, allowing the formation of fine beam structure. Also, since the beam and the semiconductor element have the same coefficient of thermal expansion, it is possible to prevent position deviation between the probes and the electrode pads, which may be produced during testing. Further, when dry-etching processing is applied to the outline-forming method for the beam of silicon, a curvature can be formed at root portions of the beam on which stress may concentrate, thereby allowing the increased rigidity of the whole beam.

When the above described structure is applied to the narrow-pitch electrode pads of a semiconductor element to be tested, the probes can be reliably formed even in portions in which the forming of individual beams is impossible, and further contact manner applying a low pressing force can be realized.

According to the present invention, for the testing of the electrical characteristics of a semiconductor device, a method of manufacturing a semiconductor device can be obtained which has, for example, an efficient testing process of bringing, with high reliability, the probes into contact with the electrode pads formed with a narrow pitch on a semiconductor element to be tested and thereby allows efficient manufacturing of the semiconductor device.

Also, the invention can suppress the difference of low pressing forces among the probes not to form undesired scars on the electrode pads, thus allowing the increased life of the probes. In addition, thereby, the invention allows improvement of the manufacturing yield and reduction of the manufacturing cost, as a result, providing a semiconductor device of low cost and high reliability. As a result, the semiconductor elements or electronic components tested can be provided at very low cost.

BRIEF DESCRIPTION OF THE DRAWINGS

FIG. 3b is a cross-sectional view taken along a line IIIb—IIIb of FIG. 3a;

FIG. 3c is a cross-sectional view taken along a line IIIc—IIIc of FIG. 3a;

FIG. 6b is a cross-sectional view taken along a line VIb—VIb of FIG. 6a;

FIG. 7b is a cross-sectional view taken along a line VIIb—VIIb of FIG. 7a;

DETAILED DESCRIPTION OF THE INVENTION

A method of manufacturing a semiconductor device according to the present invention will be described with reference to FIG. 1 to FIG. 12.

First, concerning semiconductor devices such as IC and LSI, a method of manufacturing semiconductor devices according to the present invention has a so-called front process of forming integrated circuits on a surface of a wafer and testing process of testing electrical characteristics of each circuit in a predetermined stage of the front process. In the testing process, it is judges whether the circuit is defective or non-defective, in a predetermined unit such as the unit of a chip. In response to need, the manufacturing method has so-called back process including a process of separating the silicon wafer into individual chips and a process of further encapsulating the chips with resin, ceramic or the like.

For example, the above described testing of electrical characteristics can be broadly divided into a probing test for judging good or wrong of conduction between circuits in atmosphere of temperature as high as 85° C., a burn-in test for acceleratively screening failures by applying thermal and electrical stresses to the circuits in atmosphere of high temperature of about 125° C., and a final test for finally testing the circuits at high frequencies.

Figure 1:
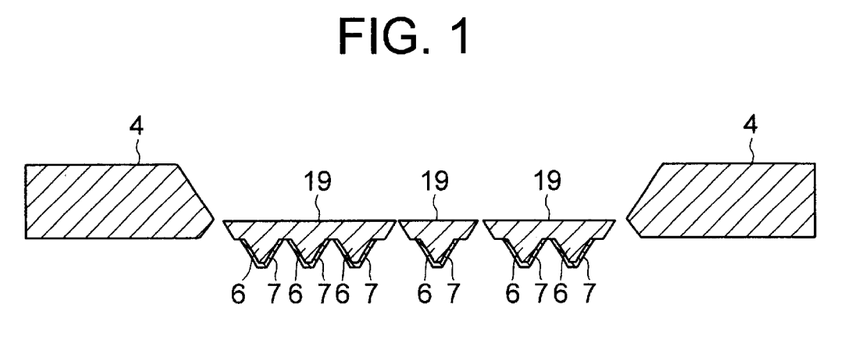
FIG. 1 is a cross-sectional view of a probe-formed substrate of a wafer-testing apparatus according to the present invention.

FIG. 1 shows a typical example of a probe-formed substrate in a testing apparatus used for the invention. The probe-formed substrate 4 is formed with both-ends-supported beams 19 which are easily deflected, and a different number of probes 6 are formed in each of the both-ends-supported beams 19. A metal wiring 7 for performing electrical exchanges is formed on surface of the probes. The beam shape of each both-ends-supported beam is determined according to the different number of the probes formed on each beam such that each probes may be subjected to approximately constant pressing force when they come into contact with electrode pads. With this structure, it is possible to form probes which can cope with electrode pads formed with a narrow pitch. Further, because a low constant pressing force can be applied to each probe, the pressed scars formed on the electrode pads are small, providing excellent conduction.

Figure 2:
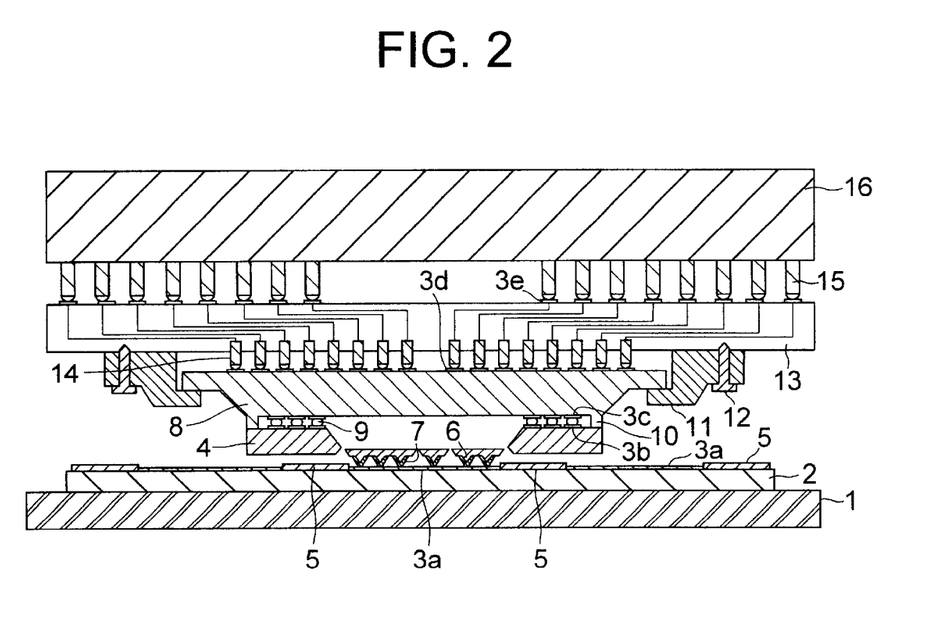
FIG. 2 is a cross-sectional view of the wafer-testing apparatus according to the present invention.

The structure of the wafer-testing apparatus of the present invention will be described with reference to FIG. 2. As shown in FIG. 2, in the configuration of the wafer-testing apparatus of the invention, easily deflectable supporting beams (among which an example of a both-ends-supported beam is shown in the present embodiment) are formed on the probe-formed substrate 4. The probes 6 are formed on the both-ends-supported beams. In the probe-formed substrate 4, metal wiring 7 continuously extend, via an insulating layer on the substrate, from the probes through through-holes (not shown) formed in the probe-formed substrate 4 to electrode pads 3b formed on a surface opposite to the probe-formed surface of the substrate 4. The detail of the probe-formed substrate will be described later.

The probe-formed substrate is fixed on an electrical connection substrate 8 by solder balls 9. In the present invention, the fixing of the probe-formed substrate to the electrical connection substrate and the electrical connection therebetween are performed at the same time by using solder balls. However, it may also be possible to use other methods, in which, for example, silver pastes and platinum pastes or metal materials and composite materials not melted at a temperature equal to or lower than 150° C. are formed instead of the solder by a screen printing method and the like and then are baked, thereby achieving the electrical conduction and the fixing of the probe-formed substrate. Multilayer wiring are formed within the electrical connection substrate 8, and the wiring fill the role of widening the electrode pads 3c arranged with a constant pitch to the intervals of the pogopins 14 arranged on a top of the electrical connection substrate. Here, the electrode pads 3c formed on the electrical connection substrate 8 are arranged like a matrix with a pitch of 1000 µm. As the materials of the electrical connection substrate, ceramic is preferable and the use of mullite is particularly desired in view of the coefficient of thermal expansion. The reason is because the electrode pads on a wafer of silicon to be tested and the probes are desired to have near coefficients of thermal expansion such that relative position deviation between them may not be caused by the burn-in test, which is performed in atmosphere of temperature ranging from 125° C. to 150° C. among various tests. Also, the electrical connection substrate 8 may have projections 10 formed thereon for preventing the solder balls from buckling, in order that the solder balls 9 cannot be crushed at a fixed value or more due to the pressing force applied thereto during testing. The electrical connection substrate 8 and the probe-formed substrate 4 are fixed by bolts 12 to a multilayer wiring substrate 13 through a jig 11. As the material of the jig, it is desirable to use materials of low thermal deformation at 150° C. or higher, such as aluminum nitride or invar. The interior of multilayer wiring substrate 13 has a structure of multilayer wiring formed therein, in which a large number of pogopins 14 are formed and connected to inner multilayer wiring. Here, the pogopin refers to an electrically conductive terminal having a spring structure. A wafer-testing apparatus 16 has pogopins or connection pins 15 arranged with an interval of the pads 3e of the multilayer wiring substrate 13, which pins are used for electrical conduction between the wafer-testing apparatus 16 and the multilayer wiring substrate 13. Also, the method of making electrical conduction between the wafer-testing apparatus 16 and the multilayer wiring substrate 13 is not limited to the above described method, and something such as a connector can be used for the wafer-testing apparatus 16, provided that it makes electrical connection therebetween.

In this way, two substrates, the electrical connection substrate 8 and the multilayer wiring substrate 13, are disposed between the probe-formed substrate 4 and the wafer-testing apparatus 16. The reason is because the electrical connection substrate 8 is configured to have multilayer wiring formed in ceramic and thus it is so high in cost that modification of the electrical connection substrate 8 cannot be performed so easily. Thus, in the case of changing the testing method and the contact points, these can be done using the multilayer wiring substrate 13 of low cost. Application to another testing apparatus can be easily performed by modifying the multilayer wiring substrate 13 of low cost. By the way, according to the number of the electrode pads and the interval between the electrode pads, the probe-formed substrate 4 can be directly connected to the multilayer wiring substrate 13 without using the electrical connection substrate 8.

A wafer 2 to be tested is fixed on a fixing stage 1 by a vacuum chuck. The fixing stage 1 is configured to have structure by which height can be controlled in the unit of a few hundred $\mu$m and pressing force can be controlled in the unit of a few grams by means of peripheral equipment of the fixing stage 1. Further, it has structure movable up and down, left and right, and in a circumferential direction. Thus, the structure can bring the pads and the probes into contact with each other while performing high-accuracy alignment between electrode pads 3a formed on the wafer 2 to be tested and the probes 6 of the probe-formed substrate 4. Also, although the function of movement for alignment is provided on the side of the fixing stage 1 in the structure described above, the invention is not limited to the above described structure. For example, the movement function for alignment may be provided on the side of the probe-formed substrate 4 or on both of the probe-formed substrate 4 and the fixing stage 1.

Description will be made of a structure of electrical conduction means for performing the exchange of an electrical signal between the wafer-testing apparatus 16 and the wafer 2 to be tested. After alignment of the wafer 2 to be tested and the probe-formed substrate 4 has been finished, the above described function is used to bring the both into contact with each other. At this time, the probe-formed substrate is pressed against a surface protection film 5 of the wafer to be tested, and warp and inclination of the wafer to be tested are suppressed, and the both-ends-supported beam of the probe-formed substrate is deflected upward, and a reaction force of the deflection applies a constant pressing force to the electrode pads 3a. In the invention, the pressing force of about 5 g was required for electrical conduction. The pressing force equal to or more than this value would provide excellent electrical conduction. However, too large pressing force may cause damage to the electrode pads 3a. By the way, electrode pads of aluminum about 80 $\mu$m square are formed on the wafer 2 to be tested. The surface protection film 5 of polyimide-based resin is formed on the periphery of the electrode pads to prevent poor contact. Also, an insulating film of polyimide and the like is formed to bury steps formed by the wiring except for the electrode pads 3b and the probes 6. Also, the above described insulating film on the surface of the probe-formed substrate 4 may be made of any other insulating material, provided that it does not cause damage to the surface protection film 5 and it is capable of resisting temperatures at least equal to or more than 150° C. Also, the probe-formed substrate 4 may be configured as a structure having grooves formed on the substrate to bury the wiring in the grooves.

The electrically conduction is obtained when the electrode pads 3a come into contact with the probes 6 of the probe-formed substrate 4. The metal wiring are formed to extend from the probes of the probe-formed substrate 4 to the electrode pads 3b, which are formed on a surface opposite to the probe-formed surface of the probe-formed substrate 4. The electrode pads 3b of the probe-formed substrate and the electrode pads 3c of the lower surface of the electrical connection substrate 8 are electrically connected through solder balls. The electrode pads 3c of the lower surface and the electrode pads 3d of the upper surface of the electrical connection substrate 8 are electrically connected through the multilayer wiring formed within the electrical connection substrate 8. Electrical exchanges between the electrode pads 3d on the upper surface of the electrical connection substrate 8 and the multilayer wiring substrate 13 are performed through pogopins 14 formed in the multilayer wiring substrate 13. Since a spring function is provided for the pogopin, even if swell occurs in the substrate, for example, reliable electrical connection can be achieved without causing poor connection. Also, because the pogopin is adopted in this portion, when an object to be tested is changed, it is easy to replace the components provided below the electrical connection substrate 8. The pogopins arranged in the multilayer wiring substrate 13 are connected to the electrode pads 3e formed on the upper surface of the multilayer wiring substrate 13 through the internal wiring of the multilayer wiring substrate. Also, the electrical exchanges between the final full-wafer testing apparatus 16 and the multilayer wiring substrate 13 are performed through pogopins or connection terminals 15 formed in the testing apparatus 16.

By using the various substrates arranged as described above, the exchange of electrical signals from the electrode pads of the wafer to be tested to the testing apparatus become possible. Also, as described above, it is easy to exchange the components lying below the electrical connection substrate 8 according to testing apparatuses for various tests. Therefore, the invention is not limited to probing tests, but it can also be used for other testing methods. For example, the invention can be applied to testing methods such as a burn-in test and a final test, wherein in the burn-in test, thermal and electrical stresses are applied to a circuit operating at a driving frequency of 5 MHz for a time period ranging from a few hours to a few tens of hours at a temperatures as high as 150° C. in order to acceleratively screen failures, and in the final test, the circuit is finally tested for high frequency operation at a driving frequency equal to or higher than 133 MHz.

Figure 3A:
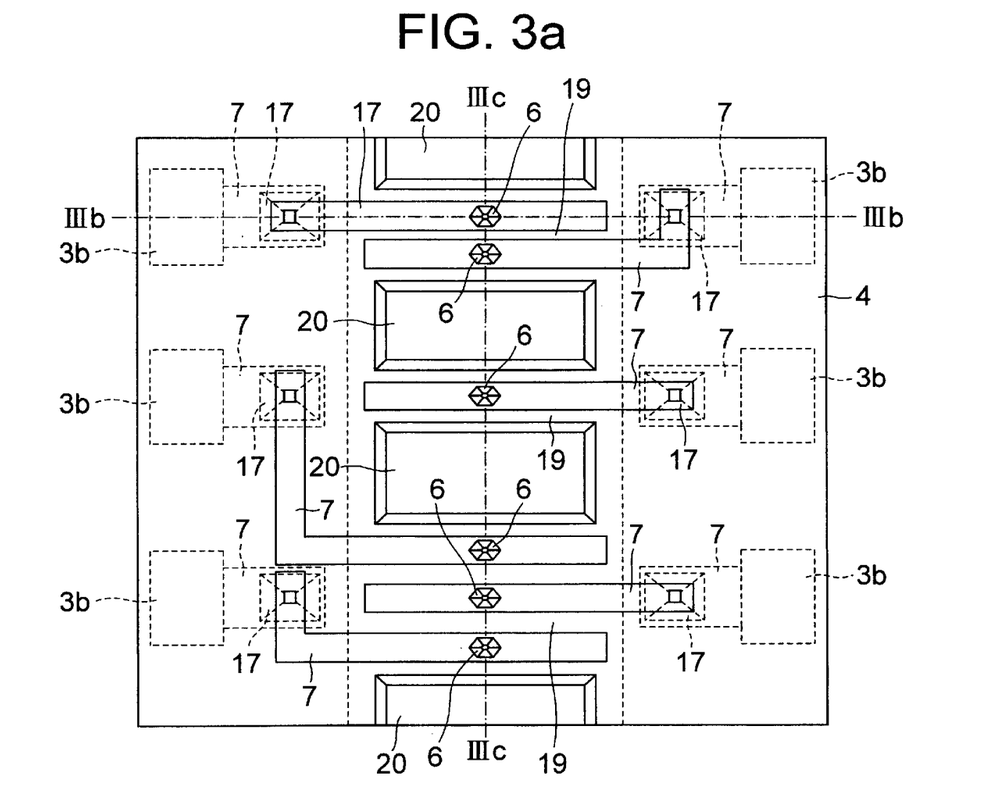
FIG. 3a is a plan view of the probe-formed substrate of the wafer-testing apparatus according to the present invention.
Figure 3B:
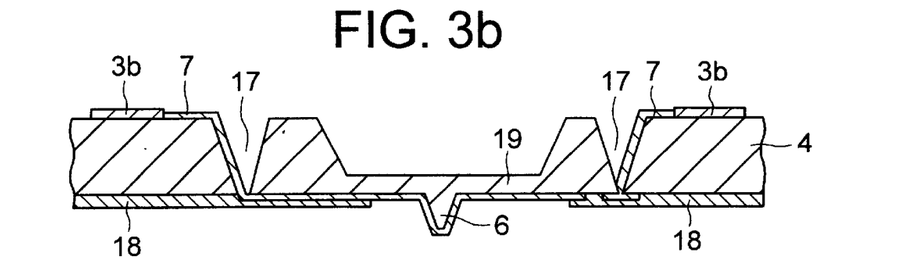
Figure 3C:
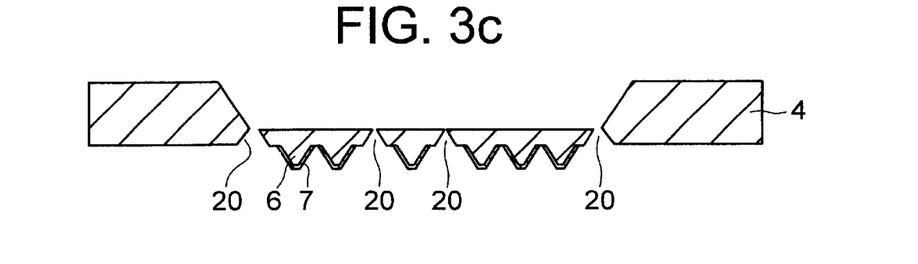

Next, the detailed structure of the probe-formed substrate 4 will be described with reference to FIG. 3 and FIG. 4. FIG. 3 shows the details of the probe-formed substrate 4. The probe-formed substrate 4 is formed of silicon material, and the both-ends-supported beams 19 and the probes 6 formed on the beams are processed by the micro-machining technology. A different number of the probes are formed on each both-ends-supported beam, and the beam widths thereof change in dimension according to the number of the probes formed on the beams. The cross-sectional shapes of the beams are formed such that individual probes may be subjected to the same pressing force. From an electrical viewpoint, a plurality of metal wiring lines 7 electrically connect from the probes 6 to the electrode pads 3b formed on the back side of the probe-formed substrate 4 through the through holes 17 formed in the probe-formed substrate 4. Also, as seen in the cross-sectional view shown in FIG. 3b, a protection film 18 is formed on the surface of the wiring 7. Further, spaces 20 are provided on peripheries of the beams shown in FIG. 3a.

In the present invention, relative position accuracy between silicon probes is very high because the silicon wafer is processed by the micro-machining technology. The reason is because the position accuracy is dependent on a mask accuracy. Generally, the accuracy of a mask is equal to or less than ±1 μm, and thus the relative position accuracy between the probes processed using such a mask may be within the same range.

Figure 4A:
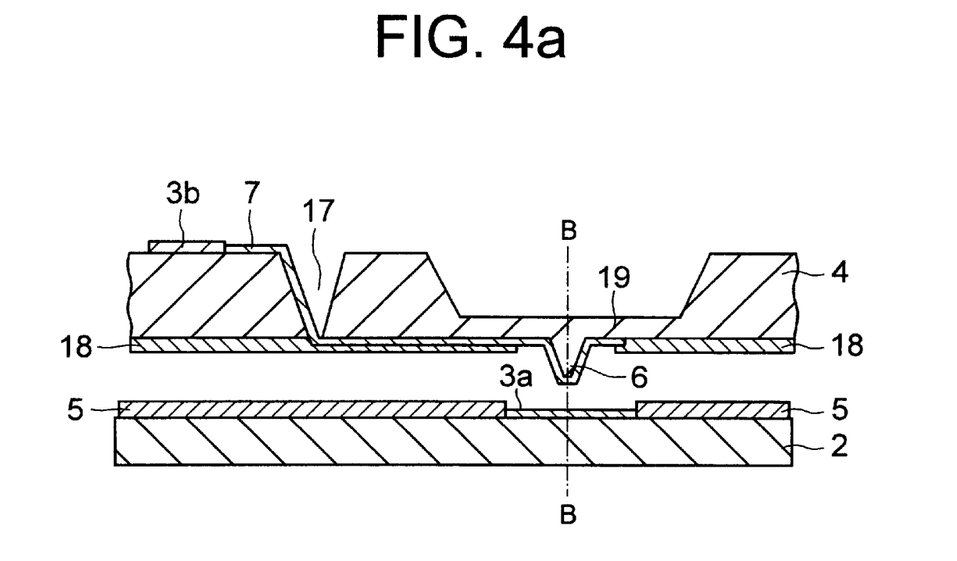
FIG. 4a is a cross-sectional view showing a state before the wafer-testing apparatus shown in FIG. 3a comes into contact with a wafer to be tested.
Figure 4B:
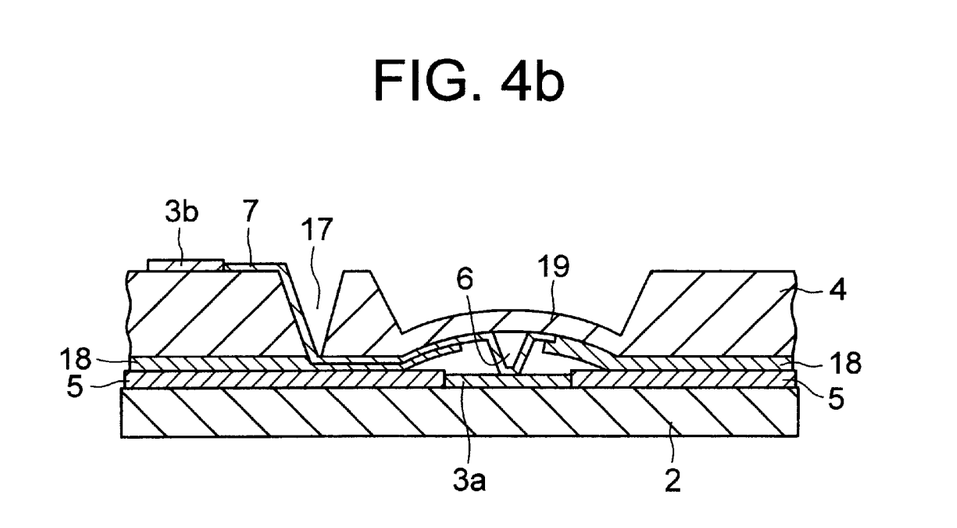
FIG. 4b is a cross-sectional view showing a state after the wafer-testing apparatus shown in FIG. 3a has come into contact with a wafer to be tested.

FIG. 4 shows the case in which the structure shown in FIG. 3 is actually brought into contact with an electrode pad. FIG. 4a shows a state before the probe comes into contact with the wafer to be tested, and FIG. 4b shows a state after the probe has come into contact with the wafer to be tested. When the probe-formed substrate 4 is brought into contact with the electrode pad 3a of the wafer 2 to be tested, the both-ends-supported beam 19 is deflected drawing an arc and the probe 6 comes perpendicularly into contact with the electrode pad 3a due to the reaction force of the deflected both-ends-supported beam. The reaction force of the beam determines a pressing force applied to the probe.

Figure 5:
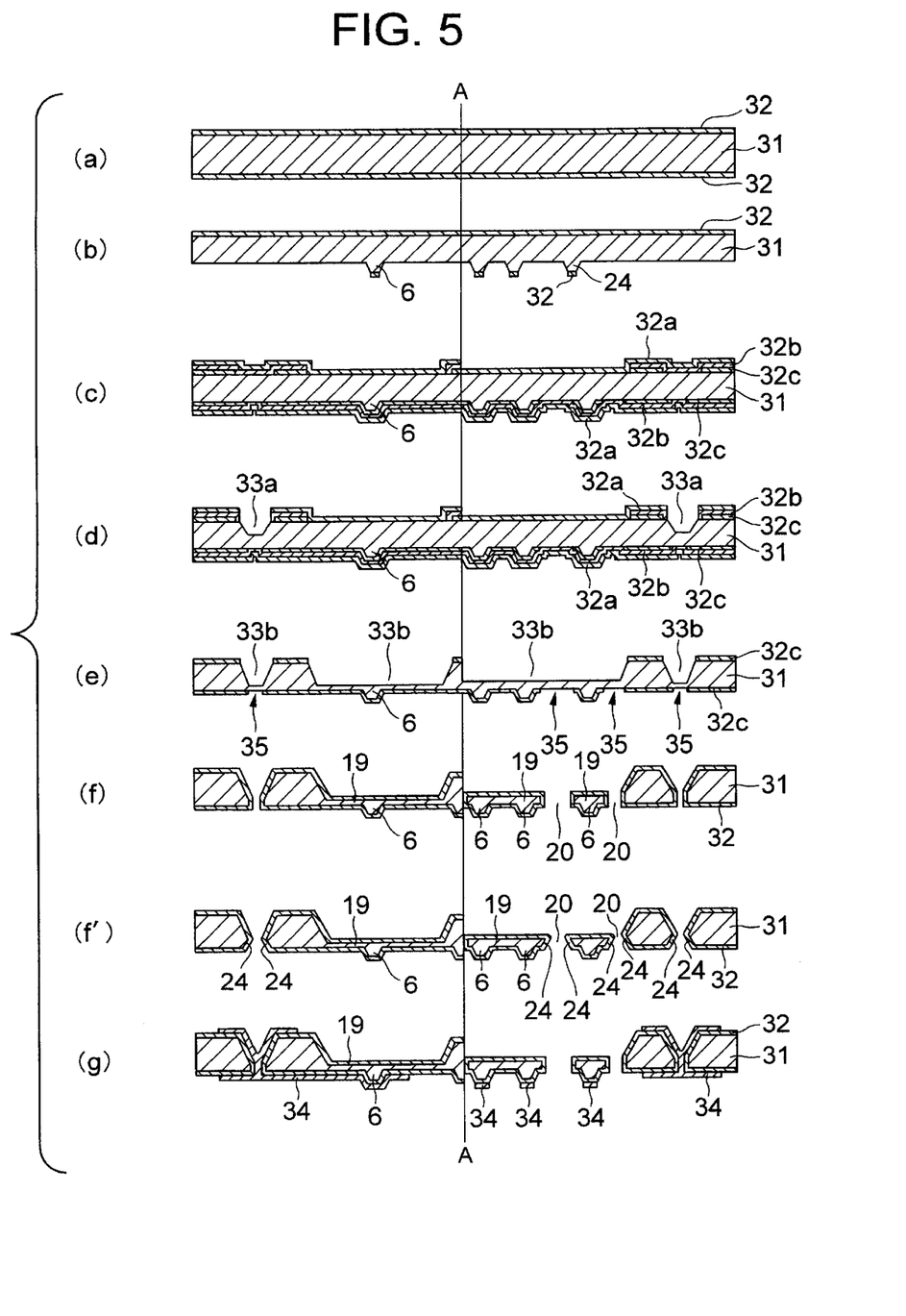
FIG. 5 is a diagram showing processing steps of processing the probe-formed substrate.

FIG. 5 shows the processing steps of forming the probe-formed substrate described up to here by means of the micro-machining technology. Herein, the cross-sectional views taken along a line IIIb—IIIb of FIG. 3 are shown in the left side of a broken line A—A of FIG. 5, and the cross-sectional views taken along a line IIIc—IIIc of FIG. 3 are shown in the right side thereof.

As shown in (a) of the drawing, a silicon wafer 31 having a thickness of 500 μm and an orientation of (100) is prepared. Then, a thermal oxide film 32 having a thickness of 0.5 μm is formed on the wafer. Using a photo-lithographic process, one surface of the thermal oxide film 32 formed on the silicon wafer 31 is subjected to resist coating, pattern exposing, developing, etching of the thermal oxide film, forming a mask pattern for forming the probe 6. In order to produce an intended shape of the probe tip, a compensation pattern for preventing corner-chamfering caused by etching is formed in the shape of the mask pattern. After that, anisotropic-etching processing for a 20 μm step is performed on the one side of the silicon wafer with a water solution of potassium hydroxide of 70° C., thereby forming the probe 6 shown in (b) of the drawing. At this time, an inclined plane of a {111} crystal face 24 is formed on the probe-formed portion. The above described etching processing of silicon may be performed using other wet etching solution such as ethylenediamine pyrocatechol, tetramethyl ammonium hydro-oxide, and hydrazine, as well as a water solution of potassium hydroxide. Further, a multilayer mask is used to perform the etching processing for etching holes of different depths at once by using time difference in a process. As shown in (c) of the drawing, using a photolithographic process, oxidation, resist coating, pattern exposing, developing, etching of a thermal oxide film and oxidation are repeatedly performed. More specifically, after forming an oxide film, patterning is performed in order of increasing depth of holes. By the way, the probe-formed substrate having the structure shown in FIG. 5 includes three different kinds of holes. First, the oxide film 32c is formed on the wafer, and the patterning for separating a probe is performed. Then, both surfaces of the wafer are oxidized to form an oxide film 32b, and patterning for etching a beam to a predetermined thickness is performed. Then, both surfaces of the wafer are oxidized to form an oxide film 32a. As shown in (d) of the drawing, after the patterning of the deepest etched hole 33a, anisotropic-etching processing is performed partway. As shown in (e) of the drawing, the oxide film 32a of the second deepest hole is removed, and the first and second deepest holes 33b are etched to their predetermined depths by anisotropic-etching processing at once. Then, as shown in (f), after removing the oxide film 32b, dry-etching processing is performed from the direction indicated by an arrow 35 using the oxide film 32c as a masking material, thereby processing a space 20 enclosed with vertical walls. As a result, the probe 6 and the both-ends-supported beam 19 are individually separated. At this time, the beams were processed to have a beam thickness of 40 μm and the probes were processed with a narrow probe-to-probe pitch of 35 μm. By using an inductively coupled plasma etching (ICP—RIE (Inductively Coupled Plasma—RIE)) apparatus as the above described dry-etching processing apparatus, the etching processing can provide a vertical wall with aspect ratio of about 20. Herein, instead of the dry-etching processing, anisotropic-etching processing can be applied to perform the processing of beam-separating. Such an example is shown in (f'). After removing the oxide film 32b, anisotropic etching is performed from the direction indicated by the arrow 35 using the oxide film 32c as a masking material, whereby a {111} crystal face 24 appears on the beam. Since the {111} crystal face becomes an inclined plane by this processing, this processing may be applied when intervals between electrode pads are large. In the above described processing technology, description has been made of the case in which the thermal oxide film is used as a masking material for anisotropic etching. However, a silicon nitride film and a composite film having a silicon nitride film formed on a thin thermal oxide film may be used as the masking material.

After that, as shown in (g) of the drawing, after an oxide film has been formed on the whole surface of the structure, a thin metal film is formed on both surfaces of the structure by using a sputtering apparatus. The thin metal film is patterned by a photo-lithographic process using electro-deposited resist. Then, copper and nickel materials are deposited on the thin metal film using a plating apparatus, thus forming multilayer wiring 34. For the above thin metal film deposited by the sputtering apparatus, a Cr layer of 20 nm thick and an Au layer of 1000 nm thick thereon are deposited. Ti may be applied instead of Cr. The reason is because Cr and Ti are used to increase the degree of adhesion between Au and the substrate. Other materials may be used for the wiring material, provided that they are not melted at a temperature equal to or lower than 150° C. and are able to be formed into an electrically conductive thin film. Also, for the apparatus used for forming the wiring and the like, apparatuses other than sputtering apparatuses, for example, evaporation apparatus and CVD (Chemical Vapor Deposition) apparatus may be used. Further, the method of forming the wiring is not limited to the lift off method. The wiring may be formed as follows. Using resist capable of forming three-dimensional resist patterns such as electro-deposited resist or a sprayed-resist coating apparatus, a thin film of resist is formed on the whole surface of a substrate. After that, photo-lithographic process is performed, and the metal film pattern is formed by etching and thereafter plating is performed thereon to form the wiring. In addition to this, a Cu layer of 8 μm and a Ni layer of 2 μm are plated on the wiring, thereby forming the multilayer wiring 34 extending from the probe to the electrode pad.

Figure 6A:
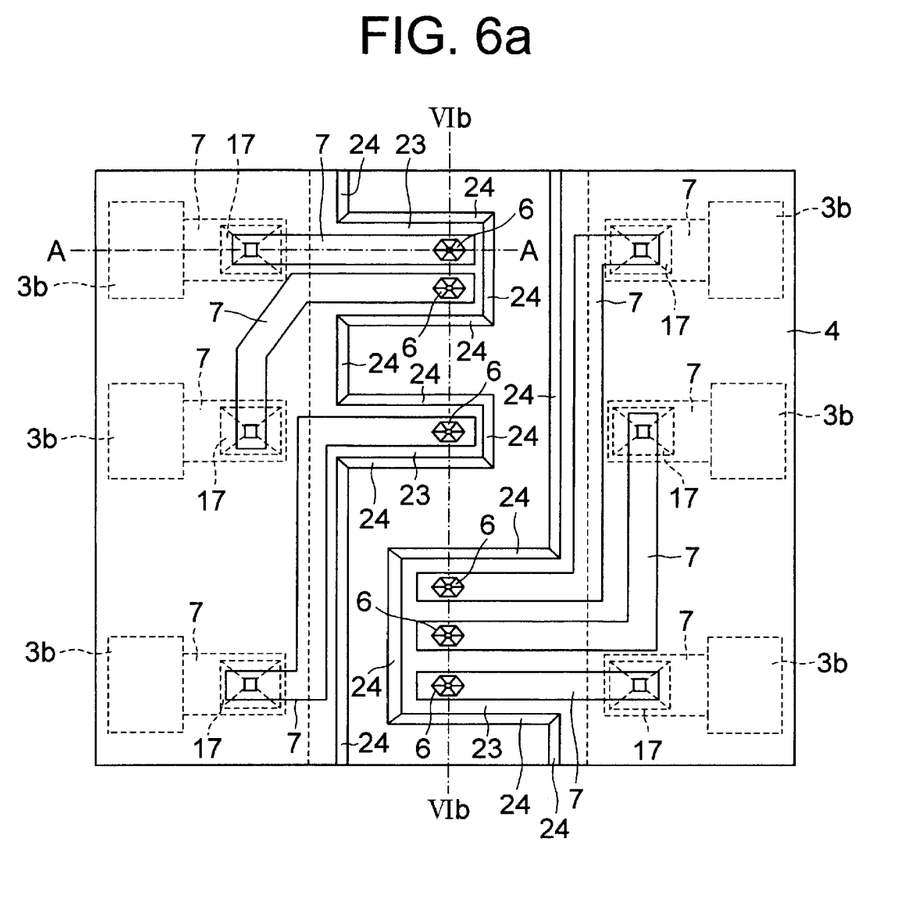
FIG. 6a is a plan view of the probe-formed substrate when viewed from a probe side.
Figure 6B:
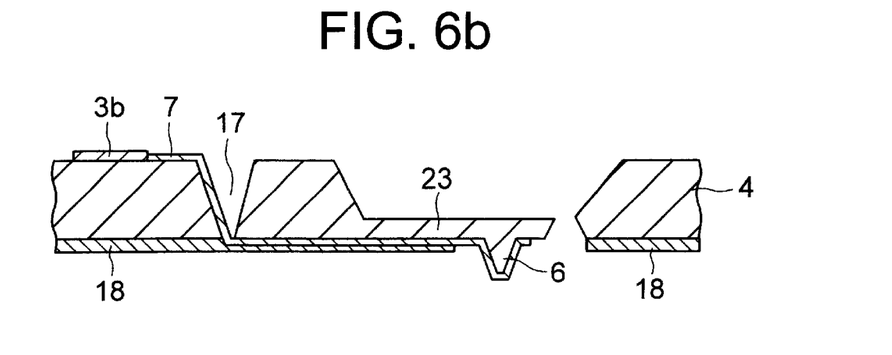

Next, another embodiment of the invention will be described. FIG. 6 shows an example of an application of a cantilever. FIG. 6a shows a plan view of the probe-formed substrate viewed from the probe side, and FIG. 6b shows the cross section taken along a line VIb—VIb of FIG. 6a. The probe-formed substrate 4 is made of a silicon material, and cantilevers 23 and the probes 6 on the cantilevers are formed by a micro-machining technology. A different number of the probes are formed on each cantilever, and the dimensions of the cantilever widths are varied according to the number of the probes formed thereon. The cross-sectional shapes of the cantilevers are formed such that the individual probes may be subjected to the same pressing force.

From an electrical viewpoint, a plurality of the metal wiring lines 7 are electrically connected from the probes 6 to the electrode pads 3b formed on the back surface of the probe-formed substrate 4 through the through holes 17 formed in the probe-formed substrate 4. Also, as seen in the cross-sectional view shown in FIG. 6b, the protection film 18 is formed on the surface of the wiring 7. Further, since the cantilevers 23 shown in FIG. 6a are processed using the technology of anisotropic etching of silicon, the {111} crystal faces 24 are present so as to enclose the cantilevers 23. Spaces 20 are provided on peripheries of the cantilevers 23. The dry-etching processing may be applied to separation of the cantilevers, as described with reference to FIG. 5.

Figure 7A:
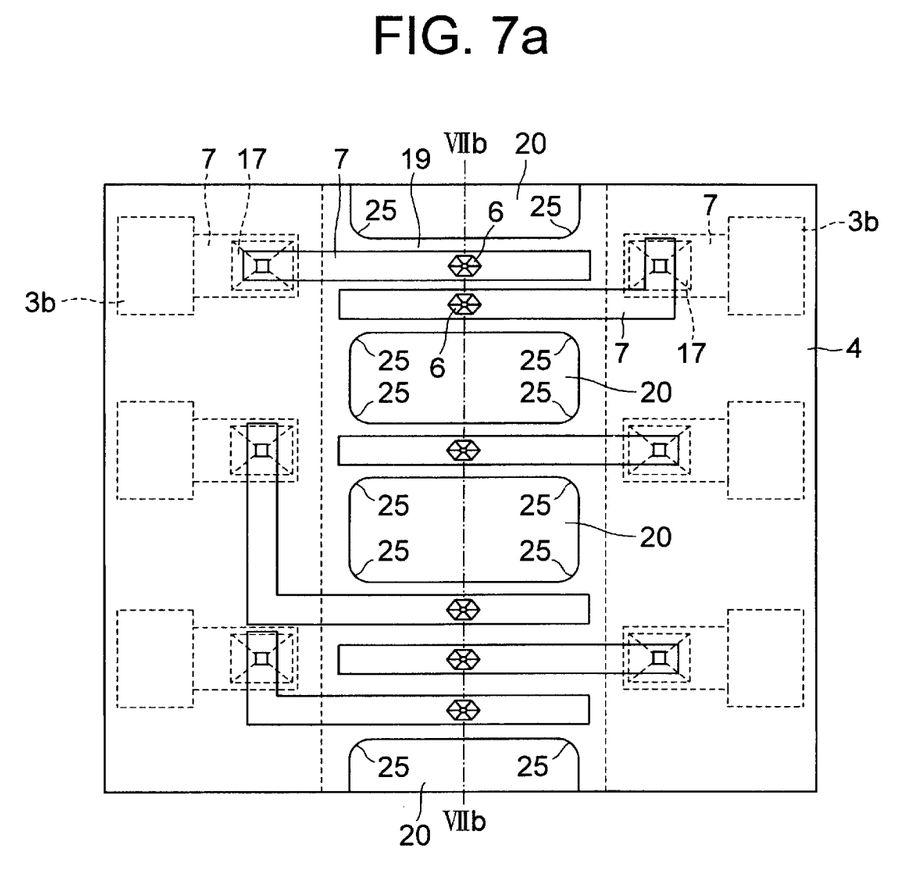
FIG. 7a is a plan view of the probe-formed substrate when viewed from the probe side.
Figure 7B:
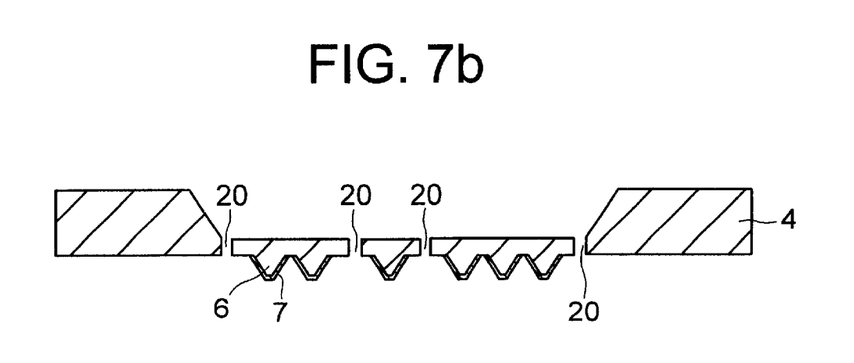

Next, description will be made of a beam shape when dry-etching processing is applied to the method of separating the beams. FIG. 7a shows a plan view of the probe-formed substrate 4 viewed from the probe side, and FIG. 7b shows the cross section taken along a line VIIb—VIIb of FIG. 7a. The drawings are views for showing the case in which dry-etching processing method is applied to the processing for separating the beams of the probe-formed substrate shown in FIG. 3. Root portions of the both-ends-supported beams shown in FIG. 7a are formed in the form of a curve 25 having a certain curvature. In this way, when the beam is formed in the form of a curve having a curvature at the root portions of the beam, the rigidity of the beam can be by far enhanced. For this reason, it is possible to form a beam highly resistant to impacts and the like. Also, by applying dry-etching processing to the method of separating the beams, it is possible to form the beams with an outline of a curve alone to reduce the stress concentration portion. In this case, the cross section of the beam becomes rectangular as shown in FIG. 7b.

Next, the beam-designing method will be described in relation to the different number of the probes formed on the beams with reference to FIG. 8. In the invention, the pressing force applied to a probe is determined by an amount of deflection of the beam. This is because the probe acts as a supporting point of the beam to receive the reaction force caused by the deflection of the beam. An amount of deflection v of the beam can be expressed by the equation (1) in the case of a both-ends-supported beam and by the equation (2) in the case of a cantilever.

$$v = WL^3/192EI \qquad (1)$$

$$v = WL^3/3EI \qquad (2)$$

where, W is a pressing force, L is a length of the beam, E is the Young's modulus, and I is the moment of inertia of area. From this equation, because the Young's modulus is constant, the pressing force applied to the probe is determined by the length of the beam and the moment of inertia of area.

On the other hand, when the beam has a rectangular cross section, the moment of inertia of area can be expressed by the equation (3).

$$I = bh^3/12 \qquad (3)$$

where, b is the width of the rectangular cross section and h is the height of the rectangular cross section.

For this reason, the pressing force of the beam is determined by the length of the beam and the width and height of the beam cross section. Concerning the height of the beam cross section, it is difficult to control the beam height or beam thickness for each beam, because the beams each are formed at once by the process shown in FIG. 5.

From the above, the pressing force is to be varied by the length and width of the beam. However, when the beam width is varied, the moment of inertia of area also varies in linear proportion to the variation in the beam width according to the equation (3). Therefore, the pressing force applied to the probe can be varied only by simply varying the beam width.

Figure 8:
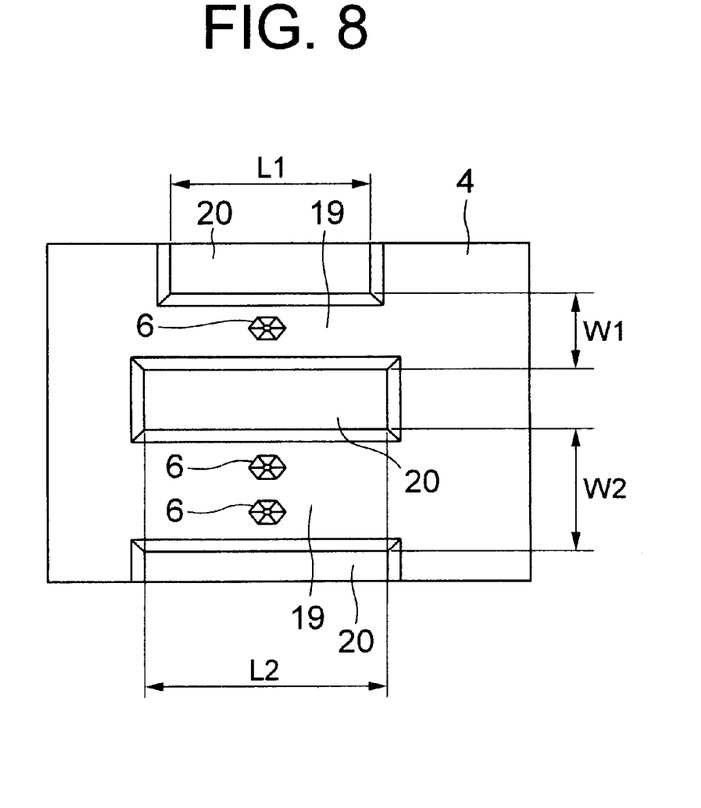
FIG. 8 is a plan view showing the relation between the number of probes and the shape of beams.

As shown in FIG. 8, in the probe-formed substrate 4, the equation (4) can express the relation between the width W1 of a beam having one probe 6 formed thereon and the width W2 of a beam having two probes 6 formed thereon.

$$W2 = 2W1 \qquad (4)$$

Thus, when the width of the beam having two probes formed thereon is made twice as wide as the width of the beam having one probe formed thereon, the pressing force applied to each probe can be made the same. However, according to the arrangement of the electrode pads on the wafer to be tested, it may be impossible in some cases to form the beam width W2. In such cases, the pressing force of each probe may be made the same by varying also the length L2 of the beam having two probes formed thereon with respect to the length L1 of the beam having one probe formed thereon.

Figure 9:
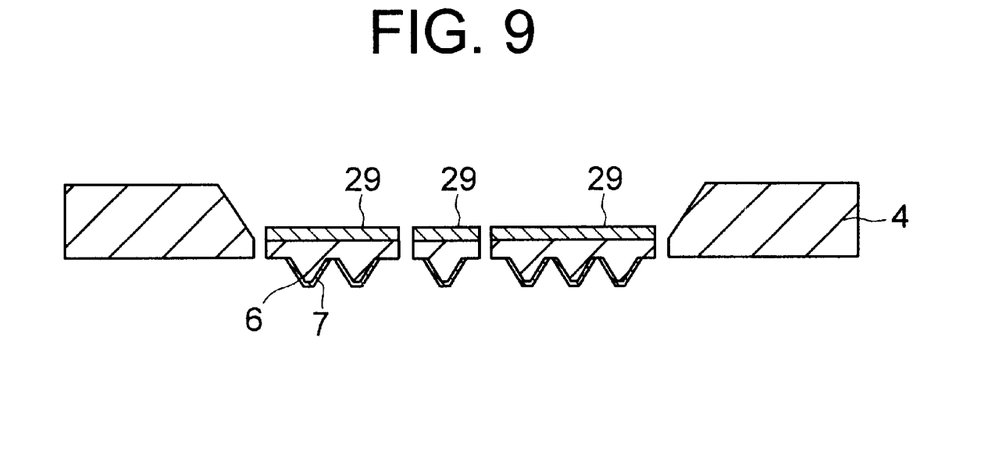
FIG. 9 is a cross-sectional view of a probe-formed substrate of a wafer-testing apparatus according to the present invention.

As described above, the pressing force of each beam according to the number of the probes can be controlled by varying mainly the beam width. However, for achieving more increased accuracy of the pressing force of each beam according to the number of the probes thereof, the cross-sectional structure shown in FIG. 9 is effective. In this structure, by forming a thin metal film 29 on a surface opposite to the probe-formed surface of the beam, variations in the pressing force is controlled. In fact, the pressing force can be controlled by varying the area of the metal film 29, and, in some case, it may be effective to use the method of forming a metal film only on the beam requiring it. Also, not only one metal but also combinations of the films of several kinds of metal may be used. Further, the material is not limited to metal, but ceramic materials and organic materials can be used for the film, provided that they can change the rigidity of the beam.

Figure 10:
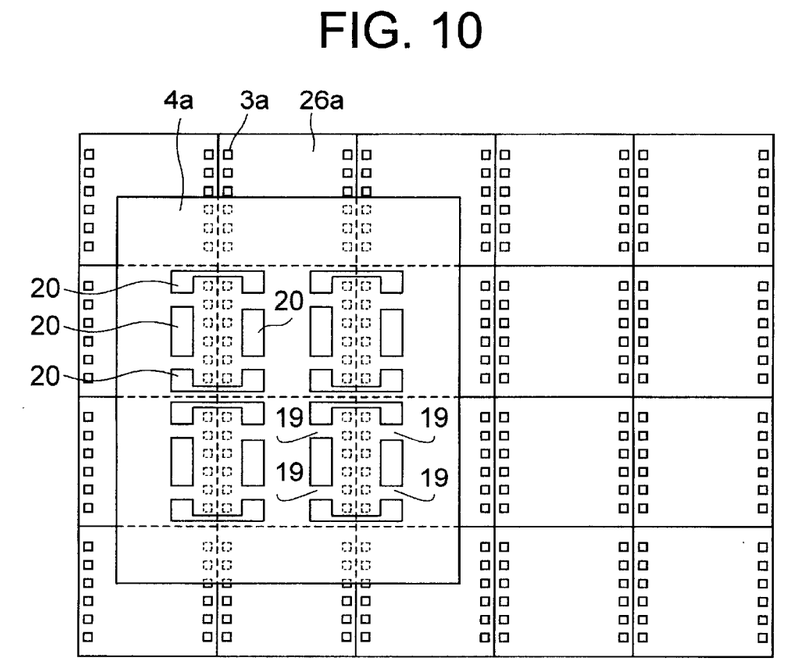
FIG. 10 is a plan view showing an arrangement pattern of the electrode pads.

In the invention, the shape and arrangement of the beams or the number of the beams and the number of the probes formed on the beams can be freely selected and arranged according to the electrode pad arrangement of various patterns formed on the wafer to be tested. One of such examples will be described with reference to FIG. 10 and FIG. 11. FIG. 10 shows a pattern in which the electrode pads 3a of semiconductor elements to be tested are arranged in line on both sides of a plurality of chips 26a. In this electrode pad configuration, the probe-formed substrate 4a has four both-ends-supported beams 19 configured for ten electrode pads 3a. By the way, the spaces 20 are formed on the peripheries of the beams.

Figure 11:
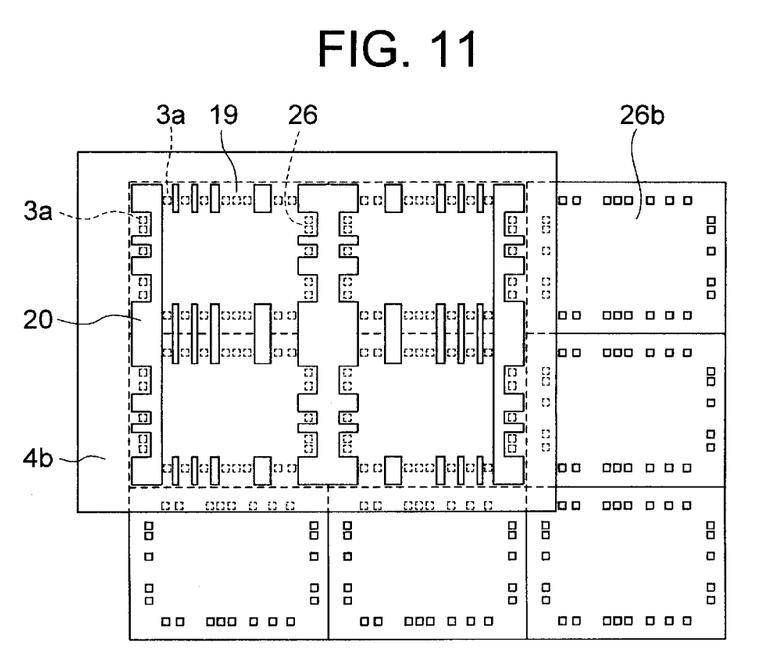
FIG. 11 is a plan view showing an arrangement pattern of the electrode patterns.

Also, FIG. 11 shows a pattern in which the electrode pads 3a of semiconductor elements to be tested for a microcomputer are arranged so as to enclose a chip 26b in a rectangle. In this electrode pad configuration, the probe-formed substrate 4b comprises both a plurality of the both-ends-supported beams 19 and a plurality of the cantilevers 26, and one probe or a plurality of the probes to be applied to the electrode pads are formed on each beam. By using this configuration, it is possible to secure an area for through holes necessary to connect the wiring to secondary electrode pads, thereby permitting a plurality of chips to be tested at the same time. Also, there is nothing wrong with using only the both-ends-supported beam or only the cantilever according to the intervals between the electrode pads. By the way, the spaces 20 are formed on the peripheries of the beams in the same manner as in FIG. 10.

Figure 12A:
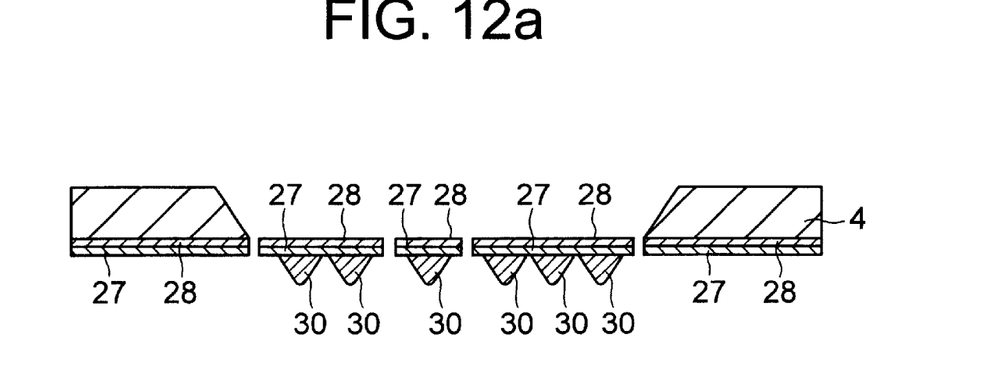
FIG. 12a is a cross-sectional view of a probe-formed substrate of a wafer-testing apparatus according to the present invention.

In each of the above described embodiments, an example applying silicon to the material of the beam has been described, but in the invention, materials other than silicon may be used for the material of the beam. An example of a structure of such a beam is shown in FIG. 12. FIG. 12*a* shows an example of a case of applying a metal beam. In this structure, metal beams 27 are formed on the probe-formed substrate 4 of silicon and at least one metal probe 30 is formed on the metal beams 27. The probes are formed of metal, and thus an insulating film 28 is formed between the metal beams and the probes to electrically insulate the probes from the metal beams. Also, rigid materials other than metal may be used for the material of the beams. Here, although an example of applying silicon to the probe-formed substrate has been described, other materials may be used for the probe-formed substrate, provided that they are near to silicon in the coefficient of thermal expansion.

Figure 12B:
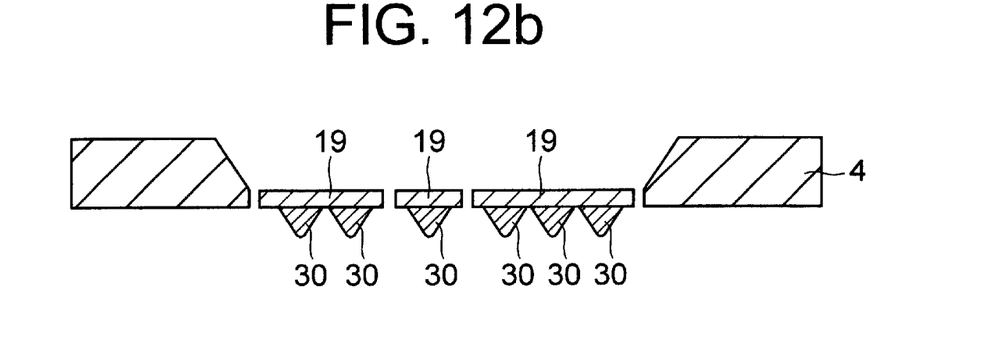
FIG. 12b is a cross-sectional view of a probe-formed substrate of a wafer-testing apparatus according to the present invention.

Also, as shown in FIG. 12*b*, there is nothing wrong with using such a structure that only the metal probes 30 are formed on the beam surface of the both-ends-supported beams 19 of silicon, which have been formed in advance on the probe-formed substrate 4. In this structure, it is possible to use different processes for the formation of the beam and for the formation of the probes, permitting the probes to be formed at target positions, and facilitating the process.

The probe-formed substrates of the invention each described above were applied to a probing test. As a result, the contact resistance between an electrode pad of a wafer to be tested and a probe end-terminal was as low as equal to or less than 5 Ω and the testing frequency not less than 150 MHz was achieved. At that time, although the atmospheric temperature was changed from room temperature to 85° C., extremely favorable contact between the electrode pads of the wafer to be tested and the probes was maintained. Also, although the invention has been described with reference to the wafer to be tested as an object to be tested, the invention may be applied to, for example, the testing of bare chips or the testing of elements having solder balls formed thereon. Also, the invention may be particularly used for applications to contact with a tape for a burn-in socket. Because devices such as semiconductor elements or semiconductor chips tested according to the present invention have scars of a constant depth on the electrode pads, it is possible to fabricate products with electrode pads of low damage. As a result, when solder balls are formed after testing, they are still satisfactorily formed, and the same electrode pads may be still used for another testing.

Thus, it becomes possible to perform electrical testing at a narrow pitch and with a high degree of reliability. The semiconductor elements or electronic components manufactured by the method of manufacturing semiconductor devices including such a process may be offered at very low cost.

Various tests may be performed by a testing apparatus adopted a beam structure in which the pressing forces applied to each probe becomes constant in response to a different number of probes formed on the beams of such a probe-formed substrate of silicon. Thereby, contact is ensured to a region of narrow-pitch electrode pads, increasing the reliability of testing and further reducing the time of testing. Further, since the testing apparatus can be used for many kinds of electrode pad arrangement structures, the range of applications of the testing apparatus will be widened to products which conventionally contact is impossible. Also, the testing apparatus is excellent in manufacturability, providing semiconductor devices of low cost and high reliability.

In the testing of electrical characteristics of semiconductor devices, the invention has, for example, an efficient process of bringing the probes into highly reliable contact with the electrode pads formed with a narrow pitch on semiconductor elements to be tested, and thus the invention can provide a semiconductor device and a method of manufacturing the semiconductor device allowing efficient manufacture of the semiconductor device.

What is claimed is:

1. A method of manufacturing a semiconductor device, including:

forming process of forming a semiconductor element having electrode pads on a semiconductor wafer, and testing process of testing the electrical performance of said formed semiconductor element, said testing process including connecting process of electrically connecting a testing apparatus to the electrode pads formed on said semiconductor element to be tested, said connecting process electrically connecting said testing apparatus to said electrode pads, said testing apparatus having a probe-formed substrate comprising a plurality of beams having probes to be electrically connected to said electrode pads, said probe-formed substrate having a first beam having at least one probe for electrically connection with said electrode pad and a second beam having a number of probes for electrical connection with the electrode pads of which number is more than the number of the electrode pads electrically connected by said first beam.

2. A method of manufacturing a semiconductor device according to claim 1, wherein said second beam has a beam cross section larger than that of said first beam.

3. A method of manufacturing a semiconductor device according to claim 1, wherein said second beam has a beam length shorter than that of said first beam.

4. A method of manufacturing a semiconductor device according to claim 1, wherein said second beam has a beam width or beam thickness larger than that of said first beam.

5. A method of manufacturing a semiconductor device, including:

forming process of forming a semiconductor element on a semiconductor wafer, and testing process of testing electrical performance of said formed semiconductor element, said testing process including connecting process of electrically connecting a testing apparatus to electrode pads formed on said semiconductor element to be tested, and said connecting process electrically connecting said testing apparatus to said electrode pads, said testing apparatus having a probe-formed substrate comprising a beam having a probe to be electrically connected to said electrode pad and a plurality of secondary electrodes connected to said probe through wiring, and said probe-formed substrate having a first wiring for connection with a first probe and having a first wiring width and a second wiring for connection with a second probe and having a second wiring width larger than said first wiring width.

6. A method of manufacturing a semiconductor device according to claim 5, wherein said second wiring has a wiring width equal to or more than twice as wide as that of said first wiring.

7. A method of manufacturing a semiconductor device according to claim 5, wherein said second wiring has a wiring width equal to or more than 10 times as wide as that of said first wiring.

8. A method of manufacturing a semiconductor device according to claim 6, wherein said first wiring is a signal line and said second wiring is a power supply line or a ground line.

9. A method of manufacturing a semiconductor device, including:

forming process of forming a semiconductor element on a semiconductor wafer, and testing process of testing electrical performance of said formed semiconductor element, said testing process including connecting process of electrically connecting a testing apparatus to an electrode pad formed on said semiconductor element to be tested, said connecting process electrically connecting said testing apparatus to said electrode pad, said testing apparatus having a probe-formed substrate comprising a plurality of beams formed thinner than the thickness of surroundings, said beams comprising a first beam having a probe to be electrically connected to said electrode pad and a second beam having no probe.

10. A method of manufacturing a semiconductor device, including:

forming process of forming a semiconductor element on a semiconductor wafer, and testing process of testing electrical performance of said formed semiconductor element, said testing process including connecting process of electrically connecting a testing apparatus to an electrode pad formed on said semiconductor element to be tested, said connecting process electrically connecting said testing apparatus to said electrode pad, said testing apparatus having a probe-formed substrate comprising a plurality of beams having a probe to be electrically connected to said electrode pad, and a first beam for connection with said probe-formed substrate through a first supporting portion, and a second beam for connection with said substrate through a second supporting portion having a number of supporting portions more than that of said first beam.

11. A method of manufacturing a semiconductor device, including:

forming process of forming a semiconductor element comprising electrode pads on a semiconductor wafer, and testing process of testing electrical performance of said formed semiconductor element, said testing process including connecting process of electrically connecting a testing apparatus to the electrode pads formed on said semiconductor element to be tested, said connecting process electrically connecting said testing apparatus to said electrode pads, said electrode pads being formed along sides of periphery of the semiconductor element after it is cut out of the wafer, said testing apparatus having a probe-formed substrate comprising a plurality of beams having probes to be electrically connected to the electrode pads, and a beam having probes for connection with the electrodes pads of at least two sides of said sides being supported on the probe-formed substrate by a plurality of supporting portions.

12. A semiconductor device, wherein it is manufactured by a manufacturing method according to claim 1.

* * * * *